(12) United States Patent
De Marco et al.

(10) Patent No.: US 11,735,404 B2
(45) Date of Patent: Aug. 22, 2023

(54) METHOD, DEVICE AND SYSTEM FOR THE TREATMENT OF BIOLOGICAL CRYOGENIC SAMPLES BY PLASMA FOCUSED ION BEAMS

(71) Applicant: FEI Company, Hillsboro, OR (US)

(72) Inventors: Alex De Marco, Melbourne (AU); Sergey Gorelick, Cheltenham (AU); Chad Rue, Portland, OR (US); Joseph Christian, Beaverton, OR (US); Kenny Mani, Beaverton, OR (US); Steven Randolph, Portland, OR (US); Matthias Langhorst, Hameln (DE)

(73) Assignee: FEI Company, Hillsboro, OR (US)

( * ) Notice: Subject to any disclaimer, the term of this patent is extended or adjusted under 35 U.S.C. 154(b) by 14 days.

(21) Appl. No.: 17/017,580

(22) Filed: Sep. 10, 2020

(65) Prior Publication Data
US 2021/0066056 A1 Mar. 4, 2021

Related U.S. Application Data

(63) Continuation of application No. 16/225,213, filed on Dec. 19, 2018, now abandoned.

(51) Int. Cl.
*H01J 37/32* (2006.01)
*H01J 49/00* (2006.01)
*G01N 1/32* (2006.01)

(52) U.S. Cl.
CPC ............ *H01J 49/0027* (2013.01); *G01N 1/32* (2013.01); *H01J 37/32009* (2013.01);
(Continued)

(58) Field of Classification Search
CPC ............ H01J 2237/0807; H01J 2237/317453; H01J 2237/31749; H01J 37/32009; G01N 1/32
See application file for complete search history.

(56) References Cited

U.S. PATENT DOCUMENTS 5,059,785 A * 10/1991 Doyle ............... H01J 37/252
850/63
6,504,159 B1 * 1/2003 Keller ............... H01J 37/08
250/423 R
(Continued)

FOREIGN PATENT DOCUMENTS

CN 103543045 A 1/2014
CN 103674635 A 3/2014
(Continued)

OTHER PUBLICATIONS

Autoflex product description. No month provided. http://www.speciation.net/Database/Instruments/Bruker-Daltonics/autoflex-II-amp-autoflex-II-TOFTOF-;i1498 (Year: 2004).*
(Continued)

*Primary Examiner* — Sean M Luck

(57) ABSTRACT

The invention relates to a method, a device and a system for the treatment of biological frozen samples using plasma focused ion beams (FIB). The samples can then be used for mass spectrometry (MS), genomics, such as gene sequencing analysis or next generation sequencing (NGS) analysis, and proteomics. The present invention particularly relates to a method of treatment of at least one biological sample. This method is particularly used for high performance microscopy, proteomics analytics, sequencing, such as NGS etc. According to the present invention the method comprises the steps of providing at least one biological sample in frozen form. The milling treats at least one part of the sample by a plasma ion beam comprising at least one of an O+ and/or a Xe+ plasma.

13 Claims, 3 Drawing Sheets

(52) U.S. Cl.
CPC ............ *H01J 2237/0807* (2013.01); *H01J 2237/31745* (2013.01); *H01J 2237/31749* (2013.01)

(56) References Cited

U.S. PATENT DOCUMENTS

| | | | |
|---|---|---|---|
| 2004/0041094 A1 | 3/2004 | Johannes Petrus Geurts et al. | |
| 2006/0260545 A1* | 11/2006 | Ramaswamy | C23C 16/56 118/719 |
| 2007/0158558 A1* | 7/2007 | Ward | B82Y 40/00 250/309 |
| 2008/0293832 A1* | 11/2008 | Yokoi | G01N 1/42 516/98 |
| 2010/0051805 A1* | 3/2010 | Rahman | H01J 37/265 250/307 |
| 2010/0136255 A1* | 6/2010 | Notte, IV | H01J 37/3056 427/534 |
| 2011/0011190 A1* | 1/2011 | Subramaniam | H01J 37/28 73/866.5 |
| 2011/0084207 A1* | 4/2011 | Zhang | H01J 37/3005 250/307 |
| 2012/0025710 A1* | 2/2012 | Klyuev | H01J 37/08 315/111.91 |
| 2012/0068067 A1* | 3/2012 | Scipioni | H01J 37/28 250/307 |
| 2012/0186973 A1* | 7/2012 | Medoff | C12P 3/00 204/157.62 |
| 2012/0241640 A1* | 9/2012 | Ward | H01J 37/28 250/396 R |
| 2013/0037706 A1 | 2/2013 | Ditto et al. | |
| 2013/0050431 A1 | 2/2013 | Yoshikawa et al. | |
| 2013/0091875 A1* | 4/2013 | Hartfield | F25D 3/107 62/62 |
| 2013/0112553 A1* | 5/2013 | Busardo | C23C 14/48 204/298.04 |
| 2013/0126731 A1* | 5/2013 | Shichi | H01J 37/261 250/310 |
| 2013/0140450 A1 | 6/2013 | Graupera et al. | |
| 2013/0248356 A1* | 9/2013 | Rue | C23F 1/00 204/192.34 |
| 2013/0250293 A1* | 9/2013 | Utlaut | H01J 37/304 356/316 |
| 2014/0138350 A1* | 5/2014 | Kelley | B05D 3/044 216/37 |
| 2014/0190934 A1* | 7/2014 | Schmidt | H01J 37/3056 216/37 |
| 2015/0047079 A1* | 2/2015 | Kozakai | H01J 37/3002 850/26 |
| 2015/0053866 A1* | 2/2015 | Aramaki | G21K 1/14 250/423 R |
| 2015/0332924 A1* | 11/2015 | Regan | H01J 37/08 438/514 |
| 2015/0348752 A1* | 12/2015 | Foord | H01J 37/3171 428/156 |
| 2016/0027607 A1* | 1/2016 | Graupera | H01J 37/05 250/282 |
| 2016/0071687 A1* | 3/2016 | Tsuchiya | H01J 37/20 250/307 |
| 2016/0093463 A1* | 3/2016 | Bhattacharjee | H01J 37/3056 315/111.31 |

FOREIGN PATENT DOCUMENTS

| | | |
|---|---|---|
| CN | 104198242 A | 12/2014 |
| CN | 104568565 A | 4/2015 |
| CN | 105143846 A | 12/2015 |
| CN | 106404512 A | 2/2017 |
| EP | 2416165 A1 | 2/2012 |
| WO | WO-2008010718 A2 | 1/2008 |

OTHER PUBLICATIONS

Microflex product description. No month provided. http://www.speciation.net/Database/Instruments/Bruker-Daltonics/microflex-LT-MALDITOF-MS-;i1496 (Year: 2005).*

Esquire6000 product description. No month provided. http://www.speciation.net/Database/Instruments/Bruker-Daltonics/esquire6000-;i1501 (Year: 2004).*

* cited by examiner

METHOD, DEVICE AND SYSTEM FOR THE TREATMENT OF BIOLOGICAL CRYOGENIC SAMPLES BY PLASMA FOCUSED ION BEAMS

The present application is a continuation of U.S. patent application Ser. No. 16/225,213, filed Dec. 19, 2018, which was based on provisional application 62/611,153, filed Dec. 28, 2017. The disclosures of the foregoing applications are incorporated herein by reference.

DESCRIPTION

Field

The invention relates to a method, a device and a system for the treatment of biological frozen samples using plasma focused ion beams (FIB). The samples can then be used for mass spectrometry (MS), genomics, such as gene sequencing analysis or next generation sequencing (NGS) analysis, and proteomics.

INTRODUCTION

The development of electron and scanning probe microscopies in the second half of the twentieth century has produced spectacular images of the internal structure and composition of matter with nanometer, molecular, and atomic resolution. Largely, this progress was enabled by computer-assisted methods of microscope operation, data acquisition, and analysis. Advances in imaging technology in the beginning of the twenty-first century have opened the proverbial floodgates on the availability of high-veracity information on structure and functionality. From the hardware perspective, high-resolution imaging methods now routinely resolve atomic positions with sub-Angstrom precision, allowing insight in the atomic structure and dynamics of materials.

Various kinds of microscopy can be relevant for the present invention, such as electron microscopy, charged-particle microscopy, Transmission Electron Microscope (TEM), Scanning Electron Microscope (SEM), and Scanning Transmission Electron Microscope (STEM), and also various sub-species, such as so-called "dual-beam" tools (e.g. a FIB-SEM), which additionally employ a Focused Ion Beam (FIB), allowing supportive activities such as ion-beam milling or Ion-Beam-Induced Deposition (I BID) or ion based imaging. This is a non-exclusive list of high performance microscopy approaches.

More specifically, in a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the beam.

As an alternative to the use of electrons as irradiating beam, charged-particle microscopy can also be performed using other species of charged particles. In this respect, the phrase "charged particle" should be broadly interpreted as encompassing electrons, positive ions (e.g. Ga or He ions), negative ions, protons and positrons, for instance.

As regards ion-based microscopy, some further information can, for example, be gleaned from sources such as the following: W. H. Escovitz, T. R. Fox and R. Levi-Setti, Scanning Transmission Ion Microscope with a Field Ion Source, Proc. Nat. Acad. Sci. USA 72(5), pp 1826-1828 (1975).

It should be noted that, in addition to imaging, a charged-particle microscope (CPM) may also have other functionalities, such as performing spectroscopy, examining diffractograms, performing (localized) surface modification (e.g. milling, etching, deposition), etc.

Although various forms of scanning microscopy have been known for decades, they have a common shortcoming that is starting to manifest itself as a bottleneck in many areas of science and technology. This shortcoming has to do with the fact that scanning-based imaging tends to be a relatively slow and tedious process, which has therefore traditionally been limited to investigating very small (portions of) specimens, e.g. on a typical scale of tens of nanometers in CPMs and tens of microns in confocal microscopy. Yet, in many areas of human endeavor, there is an increasing need to maintain the resolution offered by these techniques, but to expand their imaging areas by orders of magnitude. For example: in cellular biology, there is a desire to expand cellular-level imaging to the tissue level, e.g. so as to more clearly investigate the interaction between (different types of) cells, particularly in brain tissue, muscle tissue, neoplasms (cancer tissue), etc.

In mineralogy/petrology, there is a need to expand analyses at molecular level to the level of grains and grain boundaries, e.g. so as to more clearly investigate gas trapping behavior in stone matrix material in tracking studies, precious metal encapsulation in quartz formations, unwanted inclusions in synthetic gems and other crystals, etc.

In the semiconductor industry, there is a desire to expand investigations at the level of individual junctions to a broader qualification of entire devices and arrays of devices, e.g. as when performing quality control vis-a-vis critical dimension, overlay, contamination, etc.

However, extending current scanning microscopy techniques to such large imaging scales would entail such hugely augmented image accumulation times as to basically render such extension untenable. Therefore, despite great desire and need, current techniques are so impractical as to exclude themselves from realistic applicability in this regard.

Another problem with present-day scanning microscopy techniques can manifest itself when imaging radiation-sensitive specimens, such as (living) biological specimens, cryogenic specimens, etc. The very act of irradiating such specimens with an energetic beam (particularly a charged-particle beam) tends to cause damage (such as molecular re-arrangement/mutation, thawing, desiccation, etc.) at/near an impingement footprint of the irradiating beam. In order to mitigate this effect, one might consider reducing the intensity and/or increasing the scan speed of the irradiating beam, but such measures generally lead to an undesirable decrease in signal-to-noise ratio (SNR).

Such technologies are further described in EP 2 963 673 A1 as well as EP 2 958 131 A1 assigned to the assignee of the present invention. Such approaches have been also extensively developed in recent years by the assignee.

A further approach in microscopy relates to the site-specific analysis, deposition, and ablation of materials by a focused ion beam, also known as FIB. This a technique used particularly in the semiconductor industry, materials science and increasingly in the biological field. A FIB setup is a scientific instrument that resembles a scanning electron microscope (SEM). However, while the SEM uses a focused beam of electrons to image the sample in the chamber, a FIB setup uses a focused beam of ions instead. FIB can also be incorporated in a system with both electron and ion beam columns, allowing the same feature to be investigated using either of the beams.

Most widespread instruments are using liquid metal ion sources (LMIS), especially gallium ion sources. Ion sources based on elemental gold and iridium are also available. In a gallium LMIS, gallium metal is placed in contact with a tungsten needle, and heated gallium wets the tungsten and flows to the tip of the needle, where the opposing forces of surface tension and electric field form the gallium into a cusp shaped tip called a Taylor cone. The tip radius of this cone is extremely small (~2 nm). The huge electric field at this small tip (greater than $1 \times 10^8$ volts per centimeter) causes ionization and field emission of the gallium atoms.

Source ions are then generally accelerated to an energy of 1-50 keV (kilo-electronvolts), and focused onto the sample by electrostatic lenses. LMIS produce high current density ion beams with very small energy spread. A modern FIB can deliver tens of nano-amperes of current to a sample, or can image the sample with a spot size on the order of a few nanometers.

Focused ion beam (FIB) systems have been produced commercially for approximately twenty years, primarily for large semiconductor manufacturers. FIB systems operate in a similar fashion to a scanning electron microscope (SEM) except, rather than a beam of electrons and as the name implies, FIB systems use a finely focused beam of ions (usually gallium) that can be operated at low beam currents for imaging or at high beam currents for site specific sputtering or milling.

The gallium ($Ga^+$) primary ion beam hits the sample surface and sputters a small amount of material, which leaves the surface as either secondary ions ($i^+$ or $i^-$) or neutral atoms ($n^0$). The primary beam also produces secondary electrons ($e^-$). As the primary beam rasters on the sample surface, the signal from the sputtered ions or secondary electrons is collected to form an image.

At low primary beam currents, very little material is sputtered and modern FIB systems can easily achieve 5 nm imaging resolution (imaging resolution with Ga ions is limited to ~5 nm by sputtering and detector efficiency). At higher primary currents, a great deal of material can be removed by sputtering, allowing precision milling of the specimen down to a sub micrometer or even a nano scale.

If the sample is non-conductive, a low energy electron flood gun can be used to provide charge neutralization. In this manner, by imaging with positive secondary ions using the positive primary ion beam, even highly insulating samples may be imaged and milled without a conducting surface coating, as would be required in an SEM.

Until recently, the overwhelming usage of FIB has been in the semiconductor industry. Such applications as defect analysis, circuit modification, photomask repair, and transmission electron microscope (TEM) sample preparation of site-specific locations on integrated circuits have become commonplace procedures. The latest FIB systems have high resolution imaging capability; this capability coupled with in situ sectioning has eliminated the need, in many cases, to examine FIB sectioned specimens in a separate SEM instrument. SEM imaging is still required for the highest resolution imaging and to prevent damage to sensitive samples. However, the combination of SEM and FIB columns onto the same chamber enables the benefits of both to be utilized.

Unlike an electron microscope, FIB is inherently destructive to the specimen. When the high-energy gallium ions strike the sample, they will sputter atoms from the surface. Gallium atoms will also be implanted into the top few nanometers of the surface, and the surface will be made amorphous.

Because of the sputtering capability, the FIB is used as a micro- and nano-machining tool, to modify or machine materials at the micro- and nanoscale. FIB micro machining has become a broad field of its own, but nano machining with FIB is a field that is still developing. Commonly the smallest beam size for imaging is 2.5-6 nm. The smallest milled features are somewhat larger (10-15 nm) as this is dependent on the total beam size and interactions with the sample being milled.

FIB tools are designed to etch or machine surfaces, an ideal FIB might machine away one atom layer without any disruption of the atoms in the next layer, or any residual disruptions above the surface. Yet currently because of the sputter the machining typically roughens surfaces at the sub-micrometer length scales. A FIB can also be used to deposit material via ion beam induced deposition. FIB-assisted chemical vapor deposition occurs when a gas, such as tungsten hexacarbonyl ($W(CO)_6$) is introduced to the vacuum chamber and allowed to chemisorb onto the sample. By scanning an area with the beam, the precursor gas will be decomposed into volatile and non-volatile components; the non-volatile component, such as tungsten, remains on the surface as a deposition. This is useful, as the deposited metal can be used as a sacrificial layer, to protect the underlying sample from the destructive sputtering of the beam. From nanometers to hundred of micrometers in length, tungsten metal deposition allows metal lines to be put right where needed. Other materials such as platinum, cobalt, carbon, gold, etc., can also be locally deposited.

The drawbacks to FIB sample preparation are the above-mentioned surface damage and implantation, which produce noticeable effects when using techniques such as high-resolution "lattice imaging" TEM or electron energy loss spectroscopy. This damaged layer can be minimized by FIB milling with lower beam voltages or lower ion energies, or by further milling with a low-voltage argon ion beam after completion of the FIB process.

FIB preparation can be used with cryogenically frozen samples in a suitably equipped instrument, allowing cross sectional analysis of samples containing liquids or fats, such as biological samples, pharmaceuticals, foams, inks, and food products.

FIB is also used for Secondary ion mass spectrometry (SIMS). The ejected secondary ions are collected and analyzed after the surface of the specimen has been sputtered with a primary focused ion beam.

At lower beam currents, FIB imaging resolution begins to rival the more familiar scanning electron microscope (SEM) in terms of imaging topography, however the FIB's two imaging modes, using secondary electrons and secondary ions, both produced by the primary ion beam, offer many advantages over SEM.

FIB secondary electron images show intense grain orientation contrast. As a result, grain morphology can be readily imaged without resorting to chemical etching. Grain boundary contrast can also be enhanced through careful selection of imaging parameters. FIB secondary ion images also reveal chemical differences, and are especially useful in corrosion studies, as secondary ion yields of metals can increase by three orders of magnitude in the presence of oxygen, clearly revealing the presence of corrosion.

Another advantage of FIB secondary electron imaging is the fact that the ion beam does not alter the signal from fluorescent probes used in the labeling of proteins, thus creating the opportunity to correlate FIB secondary electron images with images obtained by fluorescence microscopes.

A further field of potential application is mass spectrometry (MS). This is an analytical technique that ionizes chemical species and sorts the ions based on their mass-to-charge ratio. In simpler terms, a mass spectrum measures the masses within a sample. Mass spectrometry is used in many different fields and is applied to pure samples as well as complex mixtures.

A mass spectrum is a plot of the intensity of the ion signal as a function of the mass-to-charge ratio. These spectra are used to determine the elemental or isotopic signature of a sample, the masses of particles and of molecules, and to elucidate the chemical structures of molecules, such as peptides and other chemical compounds.

In a typical MS procedure, a sample, which may be solid, liquid, or gas, is ionized, for example by bombarding it with electrons. This may cause some of the sample's molecules to break into charged fragments. These ions are then separated according to their mass-to-charge ratio, typically by accelerating them and subjecting them to an electric or magnetic field: ions of the same mass-to-charge ratio will undergo the same amount of deflection. The ions are detected by a mechanism capable of detecting charged particles, such as an electron multiplier. Results are displayed as spectra of the relative abundance of detected ions as a function of the mass-to-charge ratio. Correlating known masses to the identified masses or through a characteristic fragmentation pattern can identify the atoms or molecules in the sample.

Mass spectrometry is inter alia an important method for the characterization and sequencing of proteins. The two primary methods for ionization of whole proteins are electrospray ionization (ESI) and matrix-assisted laser desorption/ionization (MALDI). In keeping with the performance and mass range of available mass spectrometers, two approaches are used for characterizing proteins. In the first, intact proteins are ionized by either of the two techniques described above, and then introduced to a mass analyzer. This approach is referred to as "top-down" strategy of protein analysis. The top-down approach however is largely limited to low-throughput single-protein studies. In the second, proteins are enzymatically digested into smaller peptides using proteases such as trypsin or pepsin, either in solution or in gel after electrophoretic separation. Other proteolytic agents are also used. The collection of peptide products is then introduced to the mass analyzer. When the characteristic pattern of peptides is used for the identification of the protein the method is called peptide mass fingerprinting (PMF), if the identification is performed using the sequence data determined in tandem MS analysis it is called de novo peptide sequencing. These procedures of protein analysis are also referred to as the "bottom-up" approach. A third approach however is beginning to be used, this intermediate "middle-down" approach involves analyzing proteolytic peptide larger than the typical tryptic peptide.

A further field of interest is the massive parallel sequencing or massively parallel sequencing is any of several high-throughput approaches to DNA sequencing using the concept of massively parallel processing; it is also called next-generation sequencing (NGS) or second-generation sequencing. Some of these technologies emerged in 1994-1998 and have been commercially available since 2005. These technologies use miniaturized and parallelized platforms for sequencing of 1 million to 43 billion short reads (50-400 bases each) per instrument run.

Many NGS platforms differ in engineering configurations and sequencing chemistry. They share the technical paradigm of massive parallel sequencing via spatially separated, clonally amplified DNA templates or single DNA molecules in a flow cell. This design is very different from that of Sanger sequencing—also known as capillary sequencing or first-generation sequencing—that is based on electrophoretic separation of chain-termination products produced in individual sequencing reactions.

Various techniques are used, but each is limited in some ways. TEM can reveal structural details of proteins in their native environment, but the electron beam is very damaging to biological tissues, and the dose must be kept very low, which limits signal and resolution. Omics studies (genomics, proteomics, and metabolomics for example) are not spatially or temporally resolved. ChIP-Seq and CLIP-Seq procedures require tedious biochemical isolation steps. In-situ gene sequencing techniques such as FISSEQ cannot resolve dense regions, such as nucleoli or stress granules. Mass spectrometric proteomics can produce comprehensive, quantitative analysis of protein composition within a cell. However, MS does not provide any inherent spatial localization, and is limited by the specificity of the extraction methods used, such as fractionation or immune precipitation.

FIB milling of cryogenic samples is widely used, but $Ga^+$ FIBs are limited by a typical maximum beam current of 65 nA. Given the typical dimensions of biological samples, Ga FIB milling is usually impractically slow. Additionally, Ga contamination may negatively impact subsequent analysis. The advantage of $O^+$ FIB milling is high compatibility (reduced milling artifacts such as curtaining, and no Ga contamination) and high material removal rates on biological tissue, which enables new isolation and purification techniques such as partial organism deletion and/or organelle excision.

All patent and non-patent literature cited before and the citations contained therein are incorporated herein by reference.

SUMMARY

In light of the above, it is the object of the present invention to provide an improved and/or alternative method and device and system for the treatment of biological samples particularly in frozen or cryopreserved form.

This object is attained with a method, a device and a system according to the present invention.

The present invention particularly relates to a method of treatment of at least one biological sample. This method is particularly used for high performance microscopy, proteomics analytics, sequencing, such as NGS etc. According to the present invention the method comprises the steps of providing at least one biological sample in frozen form. This can be in vitreous or any other form that is adapted for the milling and the further analysis. The milling treats at least one part of the sample by a plasma ion beam comprising at least one of an $O^+$ and/or a $Xe^+$ plasma. Ion beams further comprising $Ar^+$, $N^+$, $Kr^+$, $Ne^+$, $He^+$ and/or $H^+$ can be used as well.

This includes inter alia any mixture of these plasmas or any other plasma. When it is further referred to $O^+$ or an $O^+$ plasma or an $O^+$ plasma beam, $O^+$, $O_2^+$, and other species as well as plasmas or plasma beams comprising $O^+$, $O_2^+$, and other O-based related species is embraced.

Dual plasma, such as PFIB is also covered.

When a $Xe^+$ plasma or plasma beam is used an $O_2$ gas can be added. This has been shown to be particularly advantageous in the protection of the sample, particularly in the surrounding of the beam in order to avoid any harm to the biological sample.

The milling can be performed by a plasma ion beam comprising at least 10% $O^+$ plasma ions, preferably at least 25%, more preferably at least 50%, more preferably at least 66%, more preferably at least 75%, more preferably at least 80%, more preferably at least 90% and more preferably almost or exactly 100% $O^+$ plasma ions. Theses plasma ions can also provide the advantageous effect of sample protection when the probe or sample is being sputtered and therefor is otherwise undergoing physical and chemical stress.

The method according to the present invention can also comprise milling a biological sample that is preferably cryopreserved or in cryogenic form or in any related state.

The further step of milling at least one part of the sample by at least one plasma ion beam at an effective beam current of at least 6 nA, preferably of at least 10 nA, preferably of at least 50 nA, more preferably of at least 100 nA, more preferably of at least 200 nA, even more preferably of at least 300 nA, even more preferably of at least 400 nA, even more preferably of at least 500 nA, even more preferably of at least 600 nA, even more preferably of at least 650 nA, even more preferably of at least 700 nA, even more preferably of at least 800 nA, even more preferably of at least 900 nA, even more preferably of at least 1000 nA can also be realized. This can support a rather fast or faster treatment and milling of the samples than before. Anyhow, the sample is not being damaged or less damaged.

The further step of milling at least one part of the sample can be further performed by at least one plasma ion beam at a mass removal rate of at least 100 $\mu m^3$/second, preferably at least 200 $\mu m^3$/second, more preferably at least 300 $\mu m^3$/second, more preferably at least 500 $\mu m^3$/second, and more preferably at least 1,000 $\mu m^3$/second. This is factors or even ten times or even multiples of this faster than the prior art while still preserving the biological sample. E.g., a milling rate of 500 $\mu m^3$/second can be obtained with a beam current of 1 uA and a target material with a milling efficiency of 0.5 $\mu m^3$/nC. If a larger beam current of 2 uA is used, a removal rate of 1000 $\mu m^3$/second can be obtained.

The invention can comprise the step of milling the sample in order to perform at least one of a removal of unwanted parts of the sample and an extraction of a target. The milling is controlled accordingly by ablating spot-wise or plane-wise with a number of ablating steps or cycles, if necessary.

Further step of accumulating a plurality of the targets in an accumulated sample can be also realized. This can be applied for many different tasks of image generation, proteomics, genomics etc.

The treatment can be a submicron treatment and the method can further comprise the step of generating at least one microscopic image at least for one of visualization and controlling the milling or both.

SEM and/or TEM microscopy can generate the microscopic image. Other microscopic approaches or a combination thereof can also be used.

The further step of analyzing the sample or the accumulated sample by mass spectrometry can be performed as well, preferably by a so-called orbitrap fusion mass spectrometer that has been shown to be particularly useful in the analysis of the such samples particularly for proteomic purposes. The invention can thus provide the further step of analyzing and/or determining proteins in the sample.

Alternatively or additionally the further step of sequencing the target(s) by next-generation-sequencing (NGS) can be performed.

The spatial information of the target can also be tracked by the present invention and further used for the analysis of the target, preferably when analyzing proteins contained in the sample.

The present invention also refers to a device for the treatment of at least one biological sample, particularly for carrying out a method described before, comprising at least one support for at least one biological sample in frozen form and at least one plasma ion beam generator configured to generate at least one plasma ion beam comprising at least one of an $O^+$ or a $Xe^+$ plasma. Ion beams further comprising $Ar^+$, $N^+$, $Kr^+$, $Ne^+$, $He^+$ and/or $H^+$ can be used as well. Any other features described before and below and claimed in connection with a method are also covered by the present invention in the device category.

The invention also comprises a dual plasma ion generator.

The device's plasma ion beam generator can be configured to generate a plasma ion beam comprising at least 10% $O^+$ plasma ions, preferably at least 25%, more preferably at least 50%, more preferably at least 66%, more preferably at least 75%, more preferably at least 80%, more preferably at least 90%, and more preferably almost or exactly 100% $O^+$ plasma ions.

The device can be also configured to realize the effective beam currents and/or mass removal rates mentioned before and claimed in context with the method according to the present invention.

The device can also comprise a microscope, preferably a SEM or a TEM microscope, for generating a microscopic image at least for one of visualization and controlling the milling.

The present invention is also directed to a system or an assembly comprising a device according to the preceding and below description and at least one of a microscope, preferably a SEM or a TEM microscope, and a mass spectrometer, preferably an orbitrap fusion mass spectrometer, and sequencing station, preferably a NGS station. By such a system a new and advantageous workflow can be realized for the proteomic analysis and sequencing.

The invention also embraces a use of a method described before, below and claimed at least for one of proteomic analyses, genomics, such as gene sequencing, and high performance microscopy, such as SEM or TEM.

The exact nature and quantity of the plasma constituents depends on many factors, including the RF power. In some cases, it may be preferred to adjust the RF power to emphasize one species over another, if there is evidence to believe that the preferentially created species will be more effective at milling the sample. Higher RF powers tend to produce more $O^+$ lower RF powers tend to produce more $O_2^+$ so that it can be adjusted accordingly.

The present invention can preferably localize proteomics data by isolating targets or regions of interest (ROI) using FIB milling of cryo-preserved cells for a more comprehensive protein composition of the cell. In contrast, using standard techniques, protein are not localized and cannot be localized so easily to a particular location in the cell.

Laser dissection methods exist to isolate some areas, but the samples must either be kept alive (discarding the time aspect) or chemically fixated which affects the proteomics results and degrades certain signals. The present invention can preferably avoid this.

The present invention enables sensitive protein analysis with high temporal and spatial resolution within a biological sample. Various techniques are currently used for protein analysis in developmental biology studies, but each is limited in some way. The present invention can use $Xe^+$ or more particularly the $O^+$ plasma FIB (also other ion species such as $Ar^+$, $N^+$, $Kr^+$, $Ne^+$, $He^+$ and/or $H^+$), which provides extremely high removal rates on cryogenically preserved biological samples, and sensitive protein detection with the mass spectrometer of the present assignee.

The invention also comprises a method or a workflow for isolating and concentrating cryogenic biological samples for mass spectrometric protein analysis and gene sequencing analysis.

Cryogenic preparation is critical because the plunge freezing process immediately stops cellular activity, thus preserving the conditions of the organism at a particular moment in time. In addition to this temporal resolution, high spatial resolution within the sample can be achieved with FIB milling techniques. Specifically, recent work of the assignee has revealed that the $O^+$ plasma FIB is highly effective at high-volume material removal on organic substrates, including cryogenic biological tissue.

The high milling rates of $O^+$ in the PFIB are uniquely exploited in one of two possible embodiments: First, $O^+$ milling can be used to delete specific regions of a sample, with the result that the subsequent protein analysis of remaining regions will not be contaminated and diluted by the protein signature of the intact bulk sample. Protein distributions can vary from region to region within a cell or organism, and this method of deleting unwanted regions helps to concentrate the true signal of interest, which can be important for studies of organism development. Second, conventional chunking and lift-out techniques can be used to excise targeted regions within the sample. This process can be repeated on multiple identical samples as needed, to achieve the necessary quantity of material appropriate to the detection limit of the subsequent analysis tool.

At present, the mass spectrometry instrument with the best sensitivity for proteomics (large scale protein extraction and analysis) is a fusion mass spectrometer of the assignee, so that a workflow combining the $O^+$ plasma FIB technology with the assignee's mass spectrometry technology will result in a uniquely powerful tool for biological sample analysis. The cryogenic preparation and site-specification afforded by the FIB enables the user to capture regions of interest with high spatial and temporal resolution, and the sensitivity of the mass spectrometer allows subtle protein variations to be detected. Thus, the invention can be a powerful new tool for biological research.

According to the invention a sample being frozen is treated, affected or crusted over by freezing and can be also in cryogenic or cryo-preserved form.

$O^+$ plasma beam enables realistic sample preparation on these larger biological samples, offering value to future switchable ion species PFIB.

The present technology will now be discussed with reference to the accompanying drawings.

DESCRIPTION OF EMBODIMENTS

Figure 1:
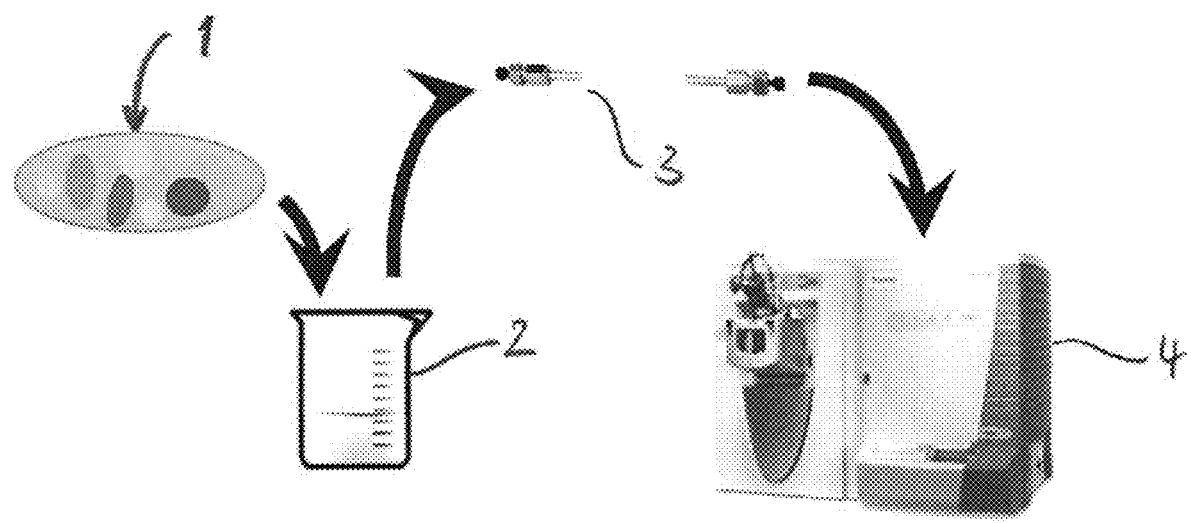
FIG. 1 depicts an embodiment of a workflow according to the prior art.

FIG. 1 schematically depicts an embodiment of a typical workflow as it is practiced in the art. A biological sample 1 shown is intended to be further analyzed, the biological sample consisting of one or more organisms, cells, structures, proteins, DNA, RNA etc. In order to analyze cells, parts of cells, proteins, RNA and/or DNA contained in the biological sample the sample 1 is exposed to one or more stages for their selected breaking apart and disintegrating etc. by one or more digestions or enzymes, symbolized by a respective container 2. The parts, molecules, proteins etc. can be further separated in a high pressure liquid chromatograph 3 (HPLC) so that the parts of particular interest can then be better isolated. These can then be transferred into a mass spectrometer 4 in order to further isolate and specify the parts, molecules, proteins etc. of interest. One disadvantage is the rather unspecified chemical and physical separation without localizing these proteins etc.

Furthermore, laser dissection is known to isolate parts of interest. However, the samples should be kept alive while discarding the time aspect or should be chemically fixated that would affect the proteomics results and can degrade signals.

Figure 2:
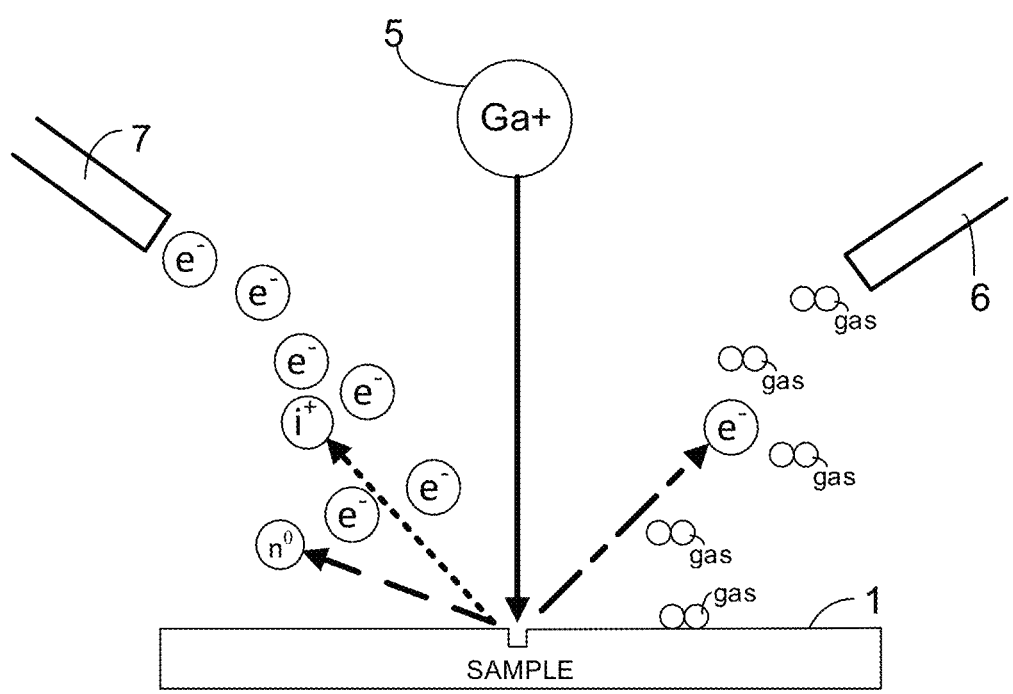
FIG. 2 shows a principle arrangement in an FIB milling station.

FIG. 2 shows an exemplifying example of an FIB sample preparation. As FIG. 2 shows, the gallium ($Ga^+$) primary ion beam generated by an $Ga^+$ ion generator 5 hits the sample surface and sputters a small amount of material, which leaves the surface as either secondary ions ($i^+$ or $i^-$) or neutral atoms ($n^0$). The primary beam also produces secondary electrons ($e^-$). As the primary beam rasters on the sample surface, the signal from the sputtered ions or secondary electrons is collected to form an image.

According to the present invention the primary ion beam now comprises $O^+$ and/or $Xe^+$ as described before and claimed below. $Ar^+$, $N^+$, $Kr^+$, $Ne^+$, $He^+$ and/or $H^+$ can be also comprised.

At low primary beam currents, very little material is sputtered and modern FIB systems can easily achieve 5 nm imaging resolution (imaging resolution with Ga ions is limited to ~5 nm by sputtering and detector efficiency). At higher primary currents, a great deal of material can be removed by sputtering, allowing precision milling of the specimen down to a sub micrometer or even a nano scale.

A gas assisted etching and/or an optional gas gun 6 can realize selected deposition. This can be applied according to the present invention, particularly when $Xe^+$ is being used as the primary ion beam $O_2$ is advantageous to be added by the gas gun 6.

If the sample is non-conductive, a low energy electron flood gun 7 can be used to provide charge neutralization. In this manner, by imaging with positive secondary ions using the positive primary ion beam, even highly insulating samples may be imaged and milled without a conducting surface coating, as would be required in an SEM.

Figure 3:
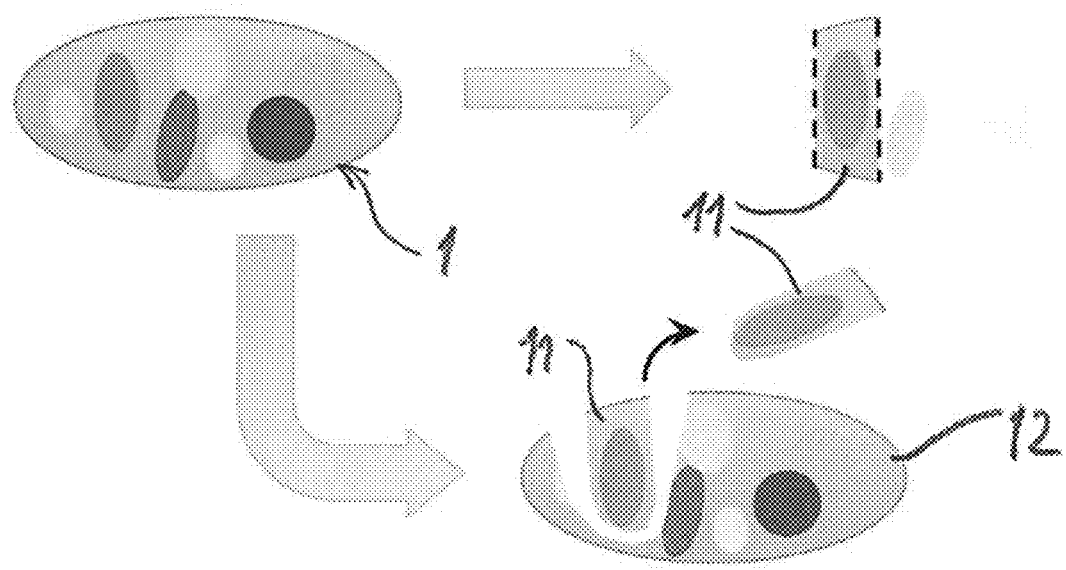
FIG. 3 depicts a result of milling in accordance with the present invention.

According to FIG. 3 the biological sample 1 can be treated according to the present invention by selecting a target 11 and/or removing unwanted parts 12. As is shown this can be done by milling the target 11 out of the unwanted part 12 or by milling and sputtering away the unwanted part 12 from the target 11. The latter is a mass-removal of the unwanted part(s) or volumes.

Figure 4:
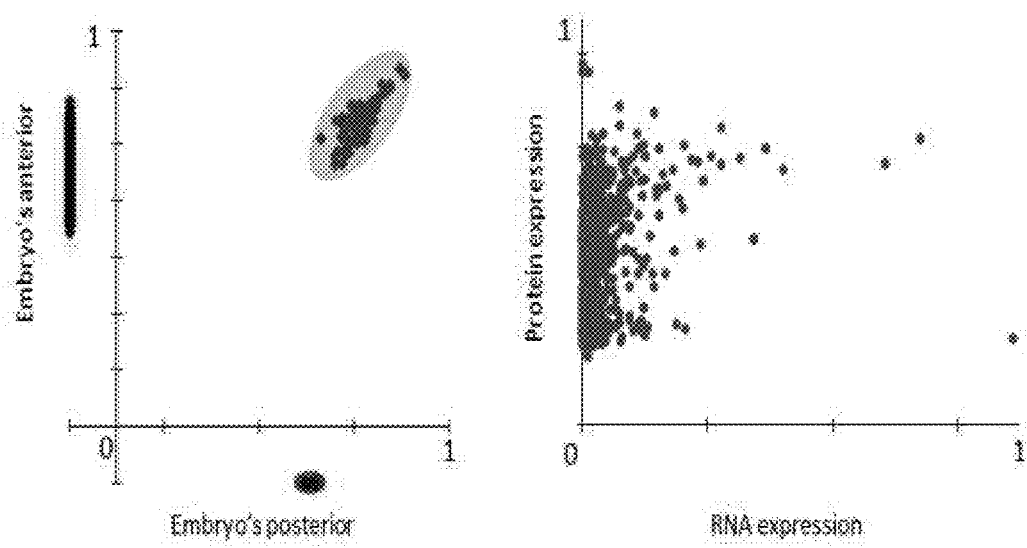
FIG. 4 shows the preparation of grids for embryo anterior and posterior, respectively.

In FIG. 4 two charts are shown. The left one exemplifies the preparation of grids for two different regions of an embryo, anterior (y-axis) and posterior (x-axis) and demonstrates one of the preferred advantages of the present invention, namely the additional use of spatial information. More particularly, FIG. 4 shows the spatial selection or distribution of the targets in a biological sample in accordance with the present invention. In the present case grids for two different regions of the embryo (*Drosophila* embryo) have been developed, anterior and posterior. More regions can be tracked as well.

The samples were run on orbitrap fusion mass spectrometer of the present assignee to identify the various proteins. As mentioned before, those can then also be spatially assigned.

To the right of FIG. 4 the distribution of the protein expression targets vis-á-vis the RNA expression targets are shown.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be the preferred order, but it may not be mandatory to carry out the steps in the recited order. That is, unless otherwise specified or unless clear to the skilled person, the order in which steps are recited may not be mandatory. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

Comparative Examples

Tests with $Ga^+$, $Xe^+$, and $O^+$ have been conducted. Sample preparation requires selectively removing large portions of cryopreserved *Drosophila* (fruit fly embryo's). The following has been observed.

With a $Ga^+$ plasma ion beam a current available was at around 50 nA. The milling rate appears to decrease as dose builds up on sample. The time required to mill appears not advantageous for the amount of samples required.

With $Xe^+$ an increase in current was allowed for a 10 times improvement in the milling rate. However, the milling rate could even be improved with $O_2$ gas.

The use of $O^+$ as a primary ion beam showed the best results for this application, achieving milling rates up to 4500 $\mu m^3$/second (45× enhancement compared to $Ga^+$). Further advantageously the samples appeared to be getting not damaged by the ion beam (probably by local heating) as expected with such high milling rates. This is even more noticeable as sample gets smaller or on samples that are not supported/submerged in ice.

The $O^+$ plasma ion beam had a voltage of 30 keV in a 1 $\mu A$ setting with an effective current of 680 nA being measured. This is more than 13 times the current compared to the $Ga^+$ ion beam set up.

In the before-mentioned example with the $O^+$ plasma ion beam the beam has undergone a CCS Pattern with 15 $\mu m$ z-depth, 1 $\mu s$ dwell time, 65% x-overlap and 85% y-overlap. Half of a *Drosophila* embryo could thus be removed in ~7 min.

The $O^+$ plasma ion beam according to the present invention can thus create a workflow allowing many samples to be prepared in a single session. In the end ~100 cells may be needed for one sample so that a very considerable time is saved compared to standard methods.

The invention claimed is:

1. A method of analyzing a biological sample, comprising: providing at least one biological sample in frozen form; milling the sample using a plasma ion beam comprising at least an $O^+$ plasma to isolate at least a target in the sample from the rest of the sample, wherein the sample is milled at a mass removal rate of at least 100 $\mu m^3$/second using the plasma ion beam, and wherein the target is cryogenically preserved for sensitive protein analysis; and analyzing the isolated target with the sensitive protein analysis, wherein the sensitive protein analysis includes proteomic analysis and/or next-generation sequencing.

2. The method of claim 1, wherein isolating at least a target from the sample by milling the sample using a plasma ion beam includes isolating the target by sputtering away at least an unwanted part adjacent to the target using the plasma ion beam.

3. The method of claim 2, further comprising transferring the isolated target to a spectrometer for the proteomic analysis.

4. The method of claim 3, wherein the spectrometer is an orbitrap fusion mass spectrometer.

5. The method of claim 2, further comprising transferring the isolated target to a next-generation sequencing platform for the next generation sequencing.

6. The method of claim 2, further comprises obtaining an accumulated sample including a plurality of targets from one or more biological samples, wherein analyzing the isolated target includes analyzing the accumulated sample.

7. The method of claim 6, wherein the plurality of targets are isolated from multiple samples using the plasma ion beam.

8. The method of claim 1, wherein an effective beam current of the plasma ion beam is at least 6 nA.

9. The method of claim 1, further comprising analyzing the isolated target based on its spatial information.

10. A system for analyzing a biological sample, comprising:

a focused ion beam system including at least one plasma ion beam generator, the plasma ion beam generator is configured to generate at least one plasma ion beam comprising at least one of an $O^+$ plasma to isolate a target of the biological sample by sputtering away at least an unwanted part of the sample using the plasma ion beam at a mass removal rate of at least 100 $\mu m^3$/second using the plasma ion beam, and wherein the target is cryogenically preserved for sensitive protein analysis; and a mass spectrometer to perform proteomic analysis on the isolated target and/or a next-generating sequencing station to perform sequencing on the isolated target.

11. The system of claim 10, wherein the plasma ion beam comprising at least 10% $O^+$ plasma ions.

12. The system of claim 10, wherein an effective beam current of plasma ion beam is of at least 6 nA.

13. The system of claim 10, wherein the mass spectrometer is an orbitrap fusion mass spectrometer.

* * * * *